(12) United States Patent
Ohmae et al.

(10) Patent No.: US 10,031,170 B2
(45) Date of Patent: Jul. 24, 2018

(54) ELECTROMAGNETIC WAVE MEASURING APPARATUS AND ELECTROMAGNETIC WAVE MEASURING METHOD

(71) Applicant: Hitachi, Ltd., Chiyoda-ku, Tokyo (JP)

(72) Inventors: Aya Ohmae, Tokyo (JP); Wen Li, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 340 days.

(21) Appl. No.: 14/765,694

(22) PCT Filed: Jan. 20, 2014

(86) PCT No.: PCT/JP2014/050882
§ 371 (c)(1),
(2) Date: Aug. 4, 2015

(87) PCT Pub. No.: WO2014/122967
PCT Pub. Date: Aug. 14, 2014

(65) Prior Publication Data
US 2015/0369850 A1    Dec. 24, 2015

(30) Foreign Application Priority Data

Feb. 5, 2013  (JP) .................................. 2013-020040

(51) Int. Cl.
*G01R 29/08*         (2006.01)
(52) U.S. Cl.
CPC ................................ *G01R 29/0878* (2013.01)
(58) Field of Classification Search
CPC ....................................... G01R 29/08–29/0892
(Continued)

(56) References Cited

U.S. PATENT DOCUMENTS 7,554,676 B2 * 6/2009 Seko ..................... G01B 11/002
250/342
8,729,909 B2 * 5/2014 Yagitani ............. G01R 29/0878
324/633
(Continued)

FOREIGN PATENT DOCUMENTS

JP       2005-233842 A      9/2005
JP       2008-288770 A      11/2008
(Continued)

OTHER PUBLICATIONS

Shinya et al.; Translation of JP 2005-233842 A—Device for Visualizing Electromagnetic Wave Generation Source and Method Thereof; Mar. 17, 2011; EPO and Google.*

(Continued)

*Primary Examiner* — Melissa Koval
*Assistant Examiner* — Rahul Maini
(74) *Attorney, Agent, or Firm* — Crowell & Moring LLP

(57) ABSTRACT

It is an object to provide an electromagnetic wave measuring apparatus and an electromagnetic wave measuring method that suppress deterioration in sensitivity of electromagnetic noise in electromagnetic wave measurement. An electromagnetic wave measuring apparatus includes a sensor that detects an electromagnetic wave and outputs a detection signal having intensity corresponding to the magnitude of energy of the detected electromagnetic wave, a resistor connected to the sensor, a first variable capacitor connected to the sensor, a voltage detection circuit connected to the sensor, a second variable capacitor connected to a wire between the sensor and the voltage detection circuit, and a capacitance adjusting unit that adjusts capacitance values of the first variable capacitor and the second variable capacitor. The electromagnetic wave measuring apparatus adjusts, in the adjusting unit, the capacitance values of the first and
(Continued)

second variable capacitors and performs electromagnetic wave measurement.

12 Claims, 17 Drawing Sheets

(58) Field of Classification Search
USPC ............... 324/684, 633; 370/280; 455/226.1
See application file for complete search history.

(56) References Cited

U.S. PATENT DOCUMENTS

| | | |
|---|---|---|
| 2005/0185195 A1 | 8/2005 | Seko |
| 2011/0128016 A1 | 6/2011 | Yagitani et al. |

FOREIGN PATENT DOCUMENTS

| | | | |
|---|---|---|---|
| JP | 2009-33324 A | 2/2009 | |
| JP | 2011-53055 A | 3/2011 | |
| WO | WO 2010/013408 A1 | 2/2010 | |
| WO | WO 2012057078 A1 * | 5/2012 | ............... H03H 7/40 |

OTHER PUBLICATIONS

Ikehata; Translation of WO 2012057078 A1—Wireless Communication Device, Method for Controlling Wireless Communication Device, Program, and Storage Medium ; May 3, 2012; EPO and Google.*

International Search Report (PCT/ISA/210) dated Apr. 8, 2014, with English translation (Five (5) pages).

Yagitani, et al., "A Tunable EBG Absorber for Radio-Frequency Power Imaging", Kanazawa University, 2011, (Four (4) pages).

* cited by examiner $C_2$ =1pF FIXED, $L_1$ =1.9nH, $L_2$ =3.8nH

| CAPACITANCE | ESTIMATED FREQUENCY | ANALYSIS RESULT |
|---|---|---|
| 0.5pF | 2.79GHz | 2.82GHz |
| 1pF | 1.97GHz | 1.99GHz |
| 2pF | 1.39GHz | 1.40GHz |

F I G . 1 3
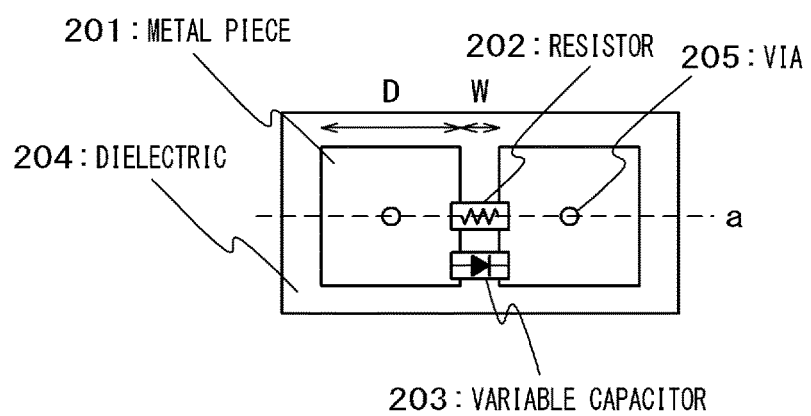

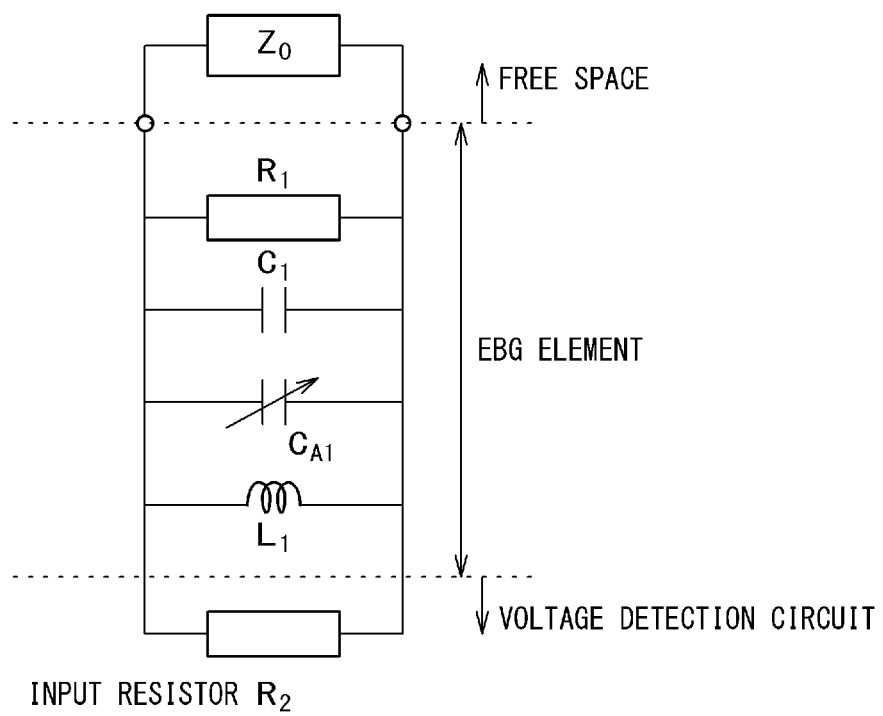
F I G . 1 5

ELECTROMAGNETIC WAVE MEASURING APPARATUS AND ELECTROMAGNETIC WAVE MEASURING METHOD

TECHNICAL FIELD

The present invention relates to an electromagnetic wave measuring apparatus and an electromagnetic wave measuring method.

BACKGROUND ART

Various electronic apparatuses that support social infrastructures are increased in speed according to enhancement of functions. The electronic apparatuses need to be designed such that electromagnetic noise radiated from the apparatuses does not cause electromagnetic interference with radio communication apparatuses that are expected to further increase in future. When an electromagnetic interference problem occurs, a quick survey in the site is necessary. There is a demand for an apparatus that visualizes an occurrence source of the electromagnetic noise on a real-time basis.

As a visualizing technique for an electromagnetic wave, there is Patent Literature 1 (JP-A-2009-33324). Patent Literature 1 mentions that "An antenna 1A includes an EBG 1, which is a reflection plate, and is configured by arranging an antenna element 15 in a position of height h above the EBG 1. In the EBG 1, square patches 11 formed small compared with an operating wavelength are cyclically arrayed in a matrix shape on the surface of a square substrate 10. A ground plane 13 is formed on the rear surface of the substrate 10. As the patches 11, in an example shown in the figure, twenty-five patches P1-1, P1-2, . . . , P5-4, and P5-5 in five rows×five columns are provided. Variable capacitors 12, which are variable capacity diodes, are connected among the patches. A resonance frequency of the EBG 1 is changed by controlling a value of a voltage +V applied to the patches 11 to change a capacitance value of the variable capacitors 12".

There is also Patent Literature 2 (JP-A-2008-288770). Patent Literature 2 mentions that " . . . includes a conductor plate 2, a plurality of metal platelets 1 having the same shape, a plurality of coupling bodies 4, and a capacitance element 6. The respective plurality of metal platelets 1 are regularly arrayed, disposed to be opposed to an upper part of the conductor plate 2, and electrically connected to the conductive plate 2 via the coupling bodies 4. The metal platelets 1 adjacent to one another are electrically connected via a plurality of the capacitance elements 6 distributedly disposed for each of the metal platelets 1 adjacent to one another".

CITATION LIST

Patent Literature

Patent Literature 1: JP-A-2009-33324
Patent Literature 2: JP-A-2008-288770

SUMMARY OF INVENTION

Technical Problem

In order to measure electromagnetic noise emitted from an apparatus or the like without causing electromagnetic interference, an electric field sensor of an electromagnetic wave measuring apparatus is desirably non-reflection. Patent Literatures 1 and 2 disclose a radio wave absorber of an EBG (Electromagnetic Band Gap) type for varying electric constants of a mounted capacitor and a mounted inductor to keep a non-reflection state at a specific frequency.

In the described conventional frequency-variable EBG, when an EBG element is used as an electric field measurement sensor, parasitic inductance and parasitic capacitance occur in a wire between the EBG element and a voltage detection circuit. Therefore, the electric field measurement sensor cannot be represented by the conventional equivalent circuit described in the literatures. A resonance frequency for keeping the non-reflection state is affected by the parasitic element. Therefore, the non-reflection state cannot be kept at a target frequency in the electric field sensor designed by the conventional equivalent circuit. It is likely that an observed voltage in the voltage detection circuit decreases.

In view of the problems, it is an object of the present invention to provide an electromagnetic wave measuring apparatus and an electromagnetic wave measuring method that suppress deterioration in sensitivity of electromagnetic noise in electromagnetic wave measurement.

Solution to Problem

In order to solve the problems, for example, a configuration described in claims is adopted.

This application includes a plurality of means for solving the problems. As one example of the means is an electromagnetic wave measuring apparatus including: a sensor that detects an electromagnetic wave and outputs a detection signal having intensity corresponding to magnitude of energy of the detected electromagnetic wave; a resistor connected to the sensor; a first variable capacitor connected to the sensor; a voltage detection circuit connected to the sensor; a second variable capacitor connected to a wire between the sensor and the voltage detection circuit; and a capacitance adjusting unit that adjusts capacitance values of the first variable capacitor and the second variable capacitor. The electromagnetic wave measuring apparatus adjusts, in the adjusting unit, the capacitance values of the first and second variable capacitors and performs electromagnetic wave measurement.

Advantageous Effect of Invention

According to the present invention, it is possible to provide an electromagnetic wave measuring apparatus and an electromagnetic wave measuring method that suppress deterioration in sensitivity of electromagnetic noise in electromagnetic wave measurement.

BRIEF DESCRIPTION OF THE DRAWINGS

FIG. 13 is a bird-eye view of extracted two cells of a cyclical structure of the low-reflection electric field sheet according to the first embodiment of the present invention.

FIG. 15 is an ideal equivalent circuit at the time when the low-reflection electric field sheet and the voltage detection circuit are connected.

DESCRIPTION OF EMBODIMENTS

First Embodiment

Figure 1:
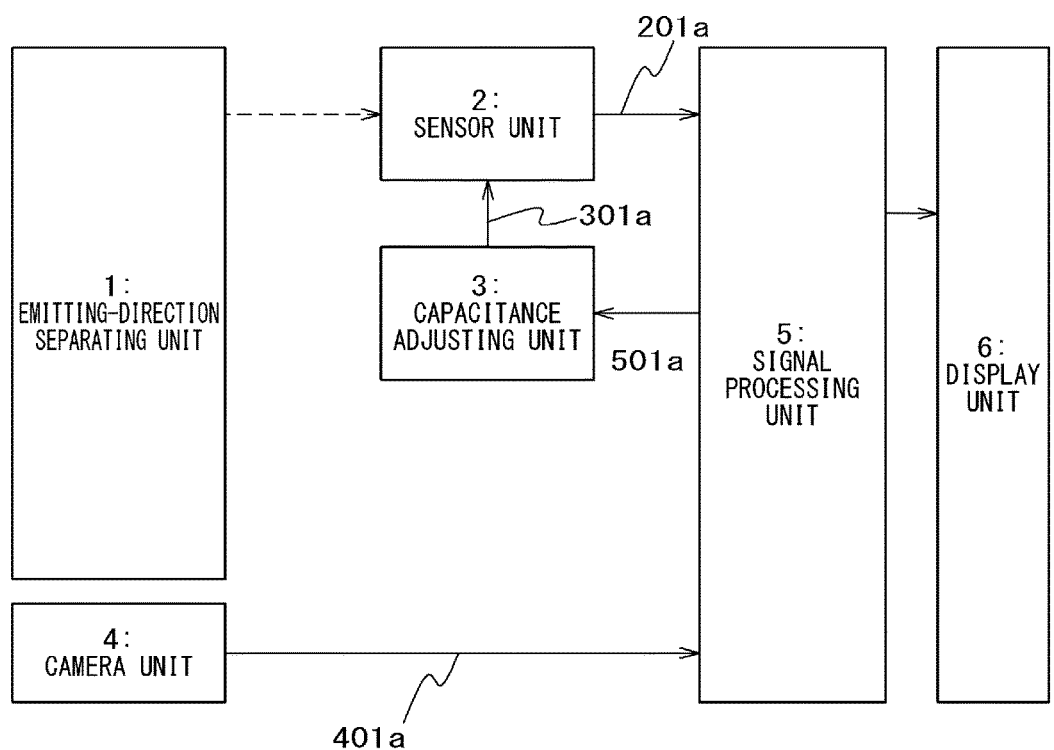
FIG. 1 is a configuration diagram of an electromagnetic wave measuring apparatus according to an embodiment of the present invention.
Figure 2:
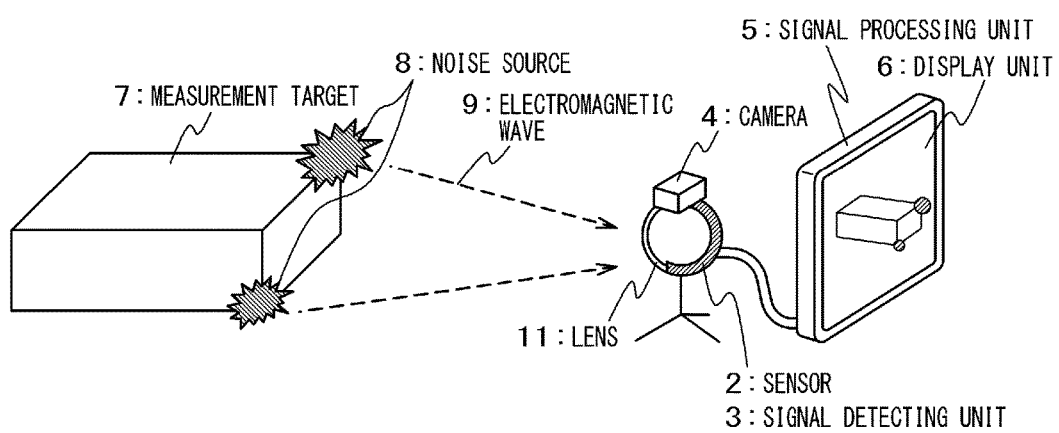
FIG. 2 is a diagram showing a measurement example (a far field) by the electromagnetic wave measuring apparatus according to the embodiment of the present invention.
Figure 3:
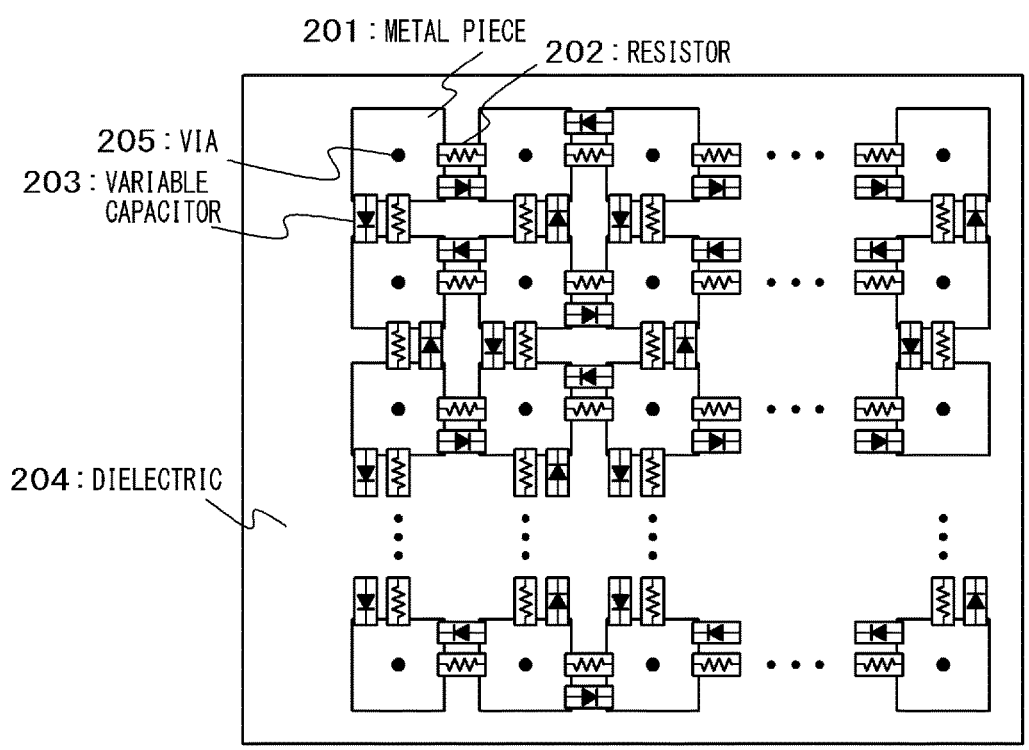
FIG. 3 is a bird-eye view of a first layer of a low-reflection electric field sheet, which is a sensor unit, according to a first embodiment of the present invention.
Figure 4:
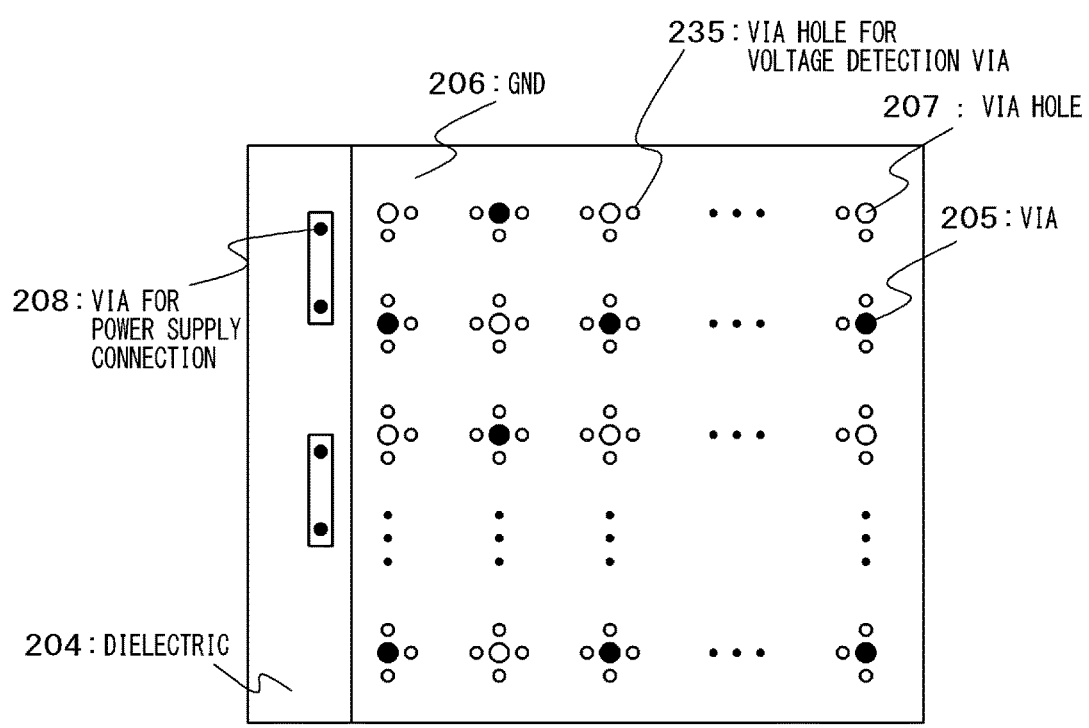
FIG. 4 is a diagram of a second layer of the low-reflection electric field sheet, which is the sensor unit, according to the first embodiment of the present invention.
Figure 5:
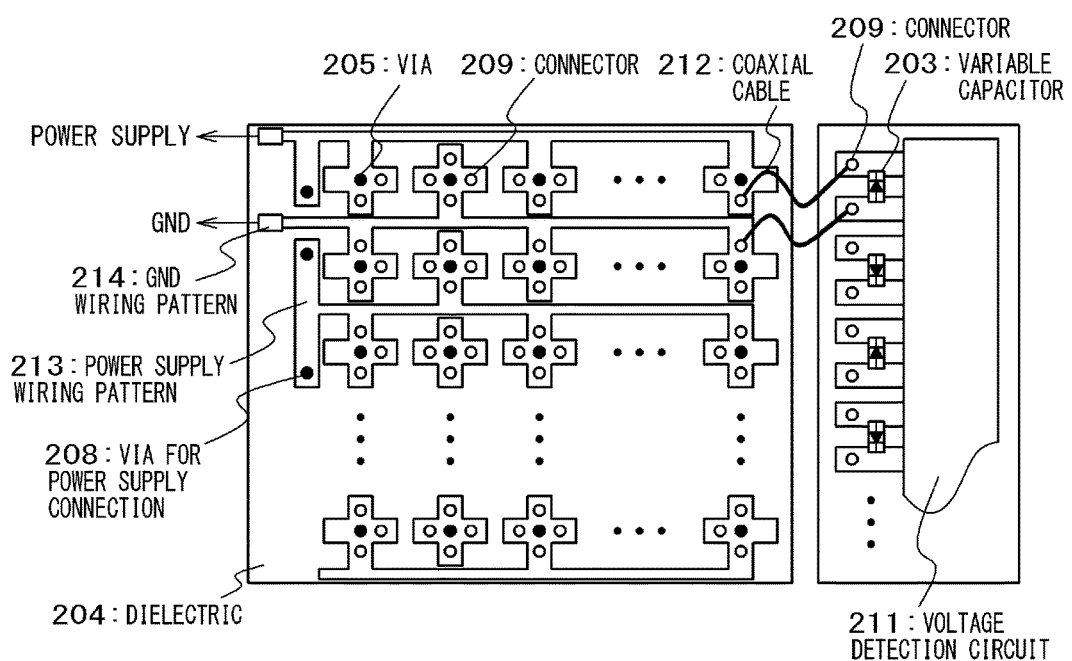
FIG. 5 is a diagram of a third layer of the low-reflection electric field sheet, which is the sensor unit, and a voltage detection circuit according to the first embodiment of the present invention.
Figure 6:
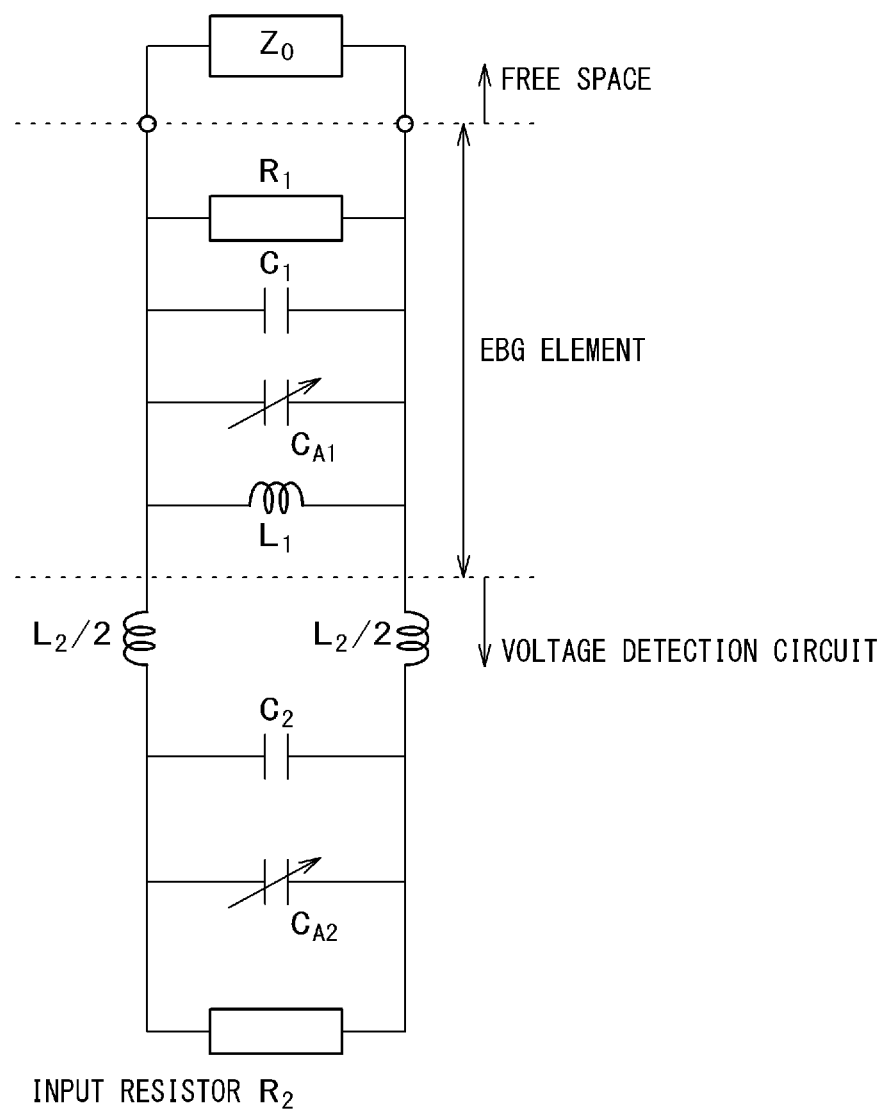
FIG. 6 is a diagram of the low-reflection electric field sheet, which is the sensor unit, and an equivalent circuit of the voltage detection circuit according to the first embodiment of the present invention.

The configuration of an electromagnetic wave measuring apparatus in an embodiment of the present invention is explained with reference to FIG. 1 to FIG. 6. FIG. 1 is a configuration diagram of the electromagnetic wave measuring apparatus according to this embodiment. FIG. 2 is a diagram showing a measurement example (a far field) by the electromagnetic wave measuring apparatus according to this embodiment. FIG. 3 to FIG. 5 are diagrams showing a sensor unit of the electromagnetic wave measuring apparatus according to this embodiment. FIG. 6 is an equivalent circuit of the sensor unit of the electromagnetic wave measuring apparatus according to this embodiment.

As shown in FIG. 1, the electromagnetic wave measuring apparatus in this embodiment is explained as an example of an electromagnetic wave visualizing apparatus including visualizing means for an electromagnetic wave.

The electromagnetic wave visualizing apparatus includes an emitting-direction separating unit 1 having a separating function for separating an emitting direction of an electromagnetic wave according to an arriving direction (an incident direction) of the electromagnetic wave, a sensor unit 2 in which a plurality of sensors that induce a voltage with energy of the electromagnetic wave are disposed, a camera unit 4, which is an image pickup unit that photographs an image of a measurement target and outputs an image signal of the photographed image, a signal processing unit 5 that processes signals from the sensor unit 2 and the camera unit 4, a display unit 6 that displays, for example, a processing result of the signal processing unit 5, and a capacitance adjusting unit 3 that adjusts a capacitance value of the sensors.

The respective sensors of the sensor unit 2 are signal-connected to the signal processing unit 5 by a transmission line 201a. The camera unit 4 is signal-connected to the signal processing unit 5 by a transmission line 401a. The capacitance adjusting unit 3 and the sensor unit 2 are signal-connected by a transmission line 301a. The signal processing unit 5 and the sensor unit 2 are signal-connected by a transmission line 501a. The signal processing unit 5 is connected to the display unit 6. The display unit 6 displays a measurement result of electromagnetic wave noise. In FIG. 1 in this embodiment, the signal processing unit 5 and the display unit 6 are separately shown. However, the signal processing unit 5 and the display unit 6 may have an integral configuration.

As the emitting-direction separating unit 1, a lens 11 is used as shown in FIG. 1. The lens converges an incident electromagnetic wave, changes, according to an arriving direction of the incident electromagnetic wave, an emitting direction and an emitting position of the electromagnetic wave emitted from the lens, and converges a plurality of electromagnetic waves respectively in different positions with respect to arriving directions of the plurality of electromagnetic waves, that is, focuses the plurality of electromagnetic waves. In the sensor unit 2, a plurality of sensors that sense energy of the electromagnetic wave emitted from the lens 11 and output a detection signal having intensity corresponding to the magnitude of the sensed energy are disposed. Therefore, the sensor present in a position corresponding to a converging position (a focus) of the electromagnetic wave made incident on the lens outputs the detection signal. That is, the sensor that outputs the detection signal is different according to a converging position of the electromagnetic wave made incident on the lens. In this embodiment, the lens is used as the emitting-direction separating unit. However, the emitting-direction separating unit is not limited to this and may be other configurations as long as the configurations have an emitting-direction separating function. Even if the electromagnetic wave measuring apparatus does not include the emitting-direction separating unit, it is possible to directly detect noise with the sensors. The lens may be configured to be detachable.

An electromagnetic wave measurement principle by the sensors of the sensor unit 2 of the present invention is explained. A low-reflection electric field sensor in this embodiment is realized by, for example, a cyclical structure of mushroom-like metal. The cyclical structure of the mushroom-like metal can control, according to dimensions of the mushroom, electric capacitance and inductance for realizing low reflection.

As shown in FIG. 3, metal pieces 201 are cyclically disposed on a first layer, which is the surface, of a tabular dielectric 204. Specifically, a plurality of metal pieces 201 are disposed in a checker shape in the row direction (the lateral direction) and the column direction (the longitudinal direction). The metal pieces 201 are connected by resistors 202 and variable capacitors 203. Vias 205 explained below are respectively provided in the centers of the metal pieces 201.

The metal pieces 201 have size sufficiently small with respect to a wavelength λ of an electromagnetic wave to be measured. The length of one side of the metal piece 201 is (1/10) λ or less. For example, when the frequency of the electromagnetic wave to be measured is 2.4 GHz, the length of one side of the metal piece 201 is 12.5 mm or less. The metal piece 201 is a square metal plate in this embodiment but is not limited to the square.

As shown in FIG. 4, a GND (ground) 206, which is a conductor functioning as a second layer opposed to the first layer, is provided on the lower surface of the dielectric 204 as a surface having size substantially the same as the surface of the dielectric 204. The GND 206 is connected to every other metal pieces 201 by the vias 205, which are conductors, across the dielectric 204. The metal pieces not connected to the GND 206 are connected to a power supply in a third layer via the via holes 207. The power supply in the third layer is connected by a power supply wiring pattern 213 and vias for power supply connection 208. Via holes for voltage detection vias 235 are provided in the GND 206. The GND 206 and the voltage detection vias do not electrically conduct.

Connectors 209 are provided on the rear surface of the dielectric 204. On the inside of a voltage detection circuit 211 connected by coaxial cables 212, voltage sensors are provided to correspond to the resistors 202 shown in FIG. 3 in a one-to-one relation. Vias for voltage sensors, which are conductors, to be connected to signal lines of the connectors 209 are provided in a form of pad-on vias at both end portions of the resistors 202. The vias are connected to signal lines of the connectors 209 shown in FIG. 5 piercing through the via holes for voltage detection vias 235 shown in FIG. 4 and are connected to the voltage detection circuit 211 of a separate substrate via the coaxial cables 212.

As shown in FIG. 5, a substrate on which the dielectric 204 and the like are stacked is connected to the voltage detection circuit 211 via the coaxial cables 212, the connectors 209, and the variable capacitors 203.

The voltage detection circuit 211 is a substrate separate from the substrate on which the dielectric 204 and the like are stacked. However, the voltage detection circuit 211 is not limited to this configuration and may be an integrated substrate.

The voltage detection circuit 211 detects, via vias for voltage detection, voltages induced at both the ends of the resistor 202. The voltage detection circuit 211 is configured by, for example, an amplifier, an AD converter, or a voltage measuring device. When an electromagnetic wave is irradiated on any one of the metal pieces 201 configuring the low-reflection electromagnetic field sheet, voltages are inducted only in the resistor 202 connected to the irradiated metal piece 201. Therefore, an arriving direction of the electromagnetic wave is known from a voltage detection position of the voltage detection circuit 211 connected to the resistor 202. At this point, if the resistor 202 is set to 377Ω same as surge impedance and the variable capacitor 203 is adjusted to resonate at the frequency in a wire including vias from the metal piece 201 to the voltage detection circuit 211, the impedances of the space and the sensor unit 2 are matched. The electromagnetic wave is not reflected and the energy of the electromagnetic wave is absorbed by the sensor unit 2.

Figure 14:
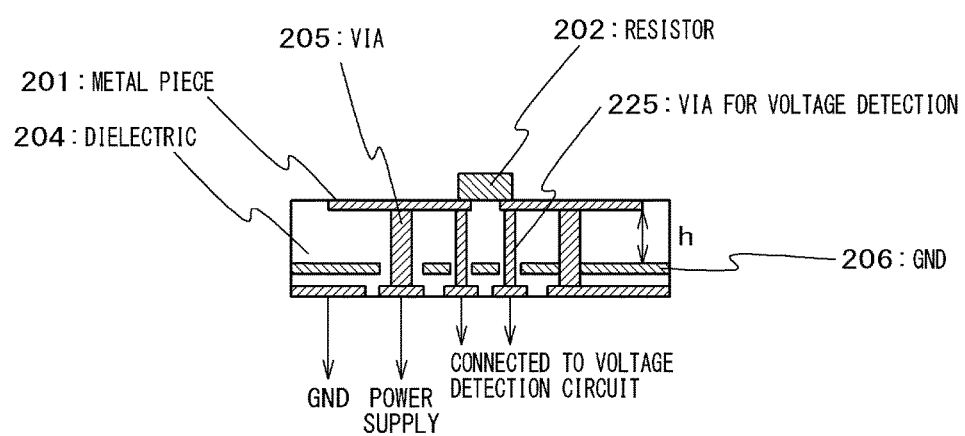
FIG. 14 is a sectional view of the extracted two cells of the cyclical structure of the low-reflection electric field sheet according to the first embodiment of the present invention.

A detailed adjustment method for the variable capacitor is explained below. Extracted two cells of the metal pieces 201 in the sensor shown in FIG. 3 to FIG. 5 are shown in FIG. 13. A sectional view at an a point in FIG. 13 is shown in FIG. 14. As shown in FIG. 14, one of the metal pieces 201 is connected to the GND layer of the second layer via the via 205 and connected to a GND of a DC power supply. The other is connected to the DC power supply. At this point, when the width of the metal piece 201 is represented as D, the distance between the metal pieces is represented as W, and the height of the metal pieces and the GND layer is represented as h, conventionally, the sensor can be represented by an equivalent circuit shown in FIG. 15. Parasitic capacitance $C_1$ and parasitic inductance $L_1$ are respectively calculated by [Expression 1] and [Expression 2].

$$C = \frac{D\varepsilon_0(\varepsilon_r + 1)}{\pi} \cosh^{-1}\left(\frac{D+w}{w}\right) \quad \text{[Expression 1]}$$

$$L = \mu_0 h \quad \text{[Expression 2]}$$

Figure 16:
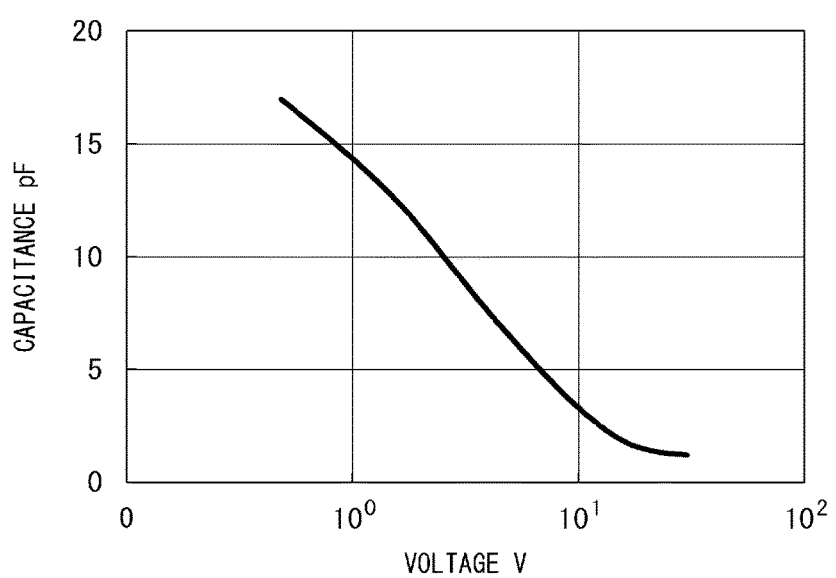
FIG. 16 is a diagram of a voltage characteristic of variable capacitance.

A space $Z_0$ in FIG. 15 is surge impedance and $R_2$ is input resistance of the voltage detection circuit. The variable capacitor 203 uses variable capacitance, a capacitance value of which changes according to voltages applied to both ends. The variable capacitance is a component, a capacitance value of which changes as shown in FIG. 16 when voltages of reverse biases are applied to both ends of an element.

For this EBG circuit to change to a non-reflection state, $L_1$ and $C_1 + C_{A1}$ only have to be parallel resonance at a desired frequency and the resistance $R_1$ only has to be 377Ω same as a value of the surge impedance $Z_0$. A frequency at this point is calculated by [Expression 3] as shown below.

$$f = \frac{1}{2\pi\sqrt{LC}} \quad \text{[Expression 3]}$$

Figure 17:
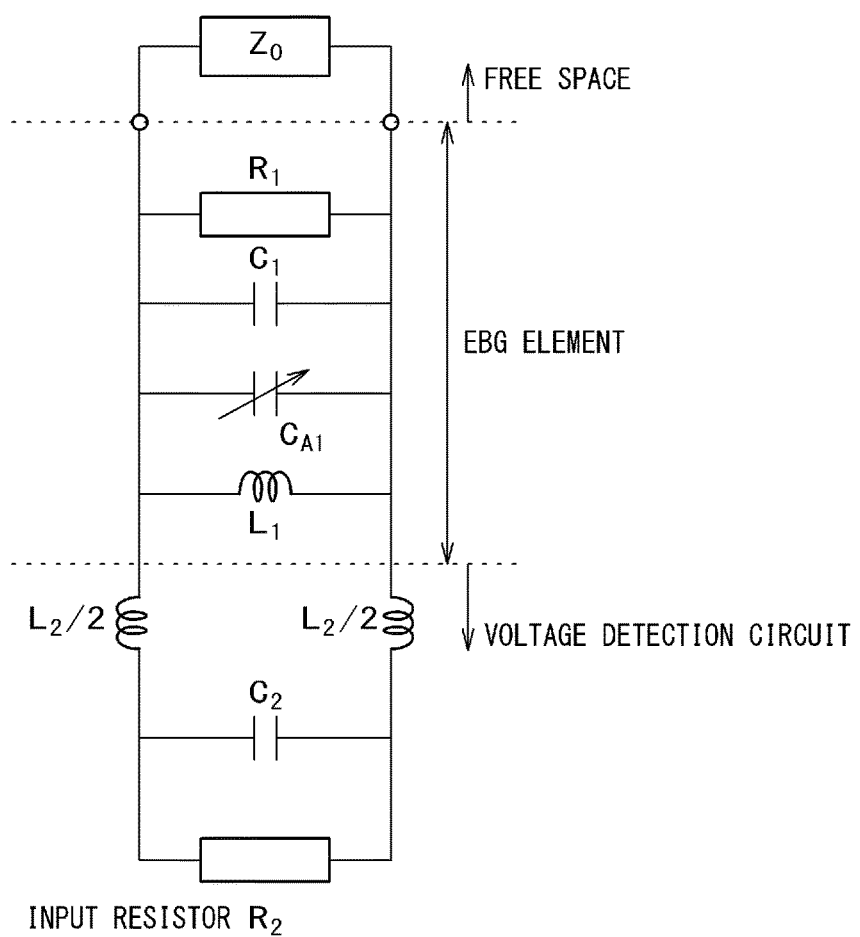
FIG. 17 is an actual equivalent circuit at the time when the low-reflection electric field sheet and the voltage detection circuit are connected.

To satisfy the condition at the desired frequency, an electric constant $C_{A2}$ of the variable capacitor 203 only has to be controlled according to a voltage. However, in the configuration of the sensor unit, if the EBG element and the voltage detection circuit are connected, actually, parasitic capacitance $C_2$ and parasitic inductance $L_2$ are present as shown in FIG. 17 because of a wire between the EBG element and the voltage detection circuit. In some case, it is likely that [Expression 3] is not satisfied even if $C_{A2}$ is adjusted.

Therefore, in the present invention, as shown in FIG. 5, the variable capacitors 203 for frequency adjustment are provided in wires between the coaxial cables 212 and the voltage detection circuit 211. All the connectors present on the sensors are connected to the voltage detection circuit 211 in a state in which the connectors are formed in pairs.

An equivalent circuit of only extracted two cells of the metal pieces is FIG. 6. $C_{A2}$ is a variable capacitor provided between the coaxial cable 212 and the voltage detection circuit 211.

According to this equivalent circuit, if an input voltage is represented as Vin and a voltage generated as an input resistance end $R_2$ of the voltage detection circuit is represented as Vm, a ratio of the input voltage Vin and the voltage Vm is [Expression 4] when the impedance of the electric field sensor is represented as $Z_{EBG}$, the impedance of the voltage detection circuit is represented as $Z_{RLC}$, and the impedance of the variable resistor $C_{A2}$ and the resistor $R_2$ is represented as $Z_{RC}$.

$$\frac{V_m}{V_{in}} = \frac{2Z_{EBG}Z_{RC}}{Z_0(Z_{EBG}+Z_{RLC})+Z_{EBG}Z_{RLC}} \quad \text{[Expression 4]}$$

The respective impedances can be represented by [Expression 5] to [Expression 8]

$$Z_{EBG} = \frac{R_1 L_1 s}{R_1 L_1 C_\alpha s^2 + L_1 s + R_1} \quad \text{[Expression 5]}$$

$$Z_{RLC} = \frac{L_2 C_\beta s^2 + \frac{L_2}{R_2} s + 1}{C_\beta s + \frac{1}{R_2}} \quad \text{[Expression 6]}$$

$$Z_{RC} = \frac{1}{C_\beta s + \frac{1}{R_2}} \quad \text{[Expression 7]}$$

$$C_\alpha = C_1 // C_{A1} C, C_\beta = C_2 // C_{A2} \quad \text{[Expression 8]}$$

In this embodiment, if the parasitic capacitances are designed to be $C_1 = C_2$ and the parasitic capacitances are variable at the variable capacitances $C_{A1} = C_{A2}$, [Expression 4] can be expanded as [Expression 9]. A frequency for obtaining a maximum voltage can be varied according to the variable capacitance.

$$f = \frac{1}{\sqrt{2}}\left\{\left(\frac{2L_1}{L_2}+1\right)\pm\sqrt{\left(\frac{2L_1}{L_2}\right)^2+1}\right\}^{\frac{1}{2}} \frac{1}{2\pi\sqrt{L_1 C}} \quad \text{[Expression 9]}$$

An effect of the variable capacitor 203 for frequency adjustment provided in the wire between the coaxial cable 212 and the voltage detection circuit 211 is explained. The equivalent circuit of the sensor according to the embodiment of the present invention is shown in FIG. 6. An equivalent circuit in the case in which the variable capacitor 203 for frequency adjustment is not provided in the wire between the coaxial cable 212 and the voltage detection circuit 211 is shown in FIG. 17. Frequency characteristics of voltages generated at both the ends of the input resistance $R_2$ in the case in which input voltages are applied to both the ends of the equivalent circuit $Z_0$ in FIG. 6 and FIG. 17 are respectively shown in FIG. 7 and FIG. 8.

Figure 7:
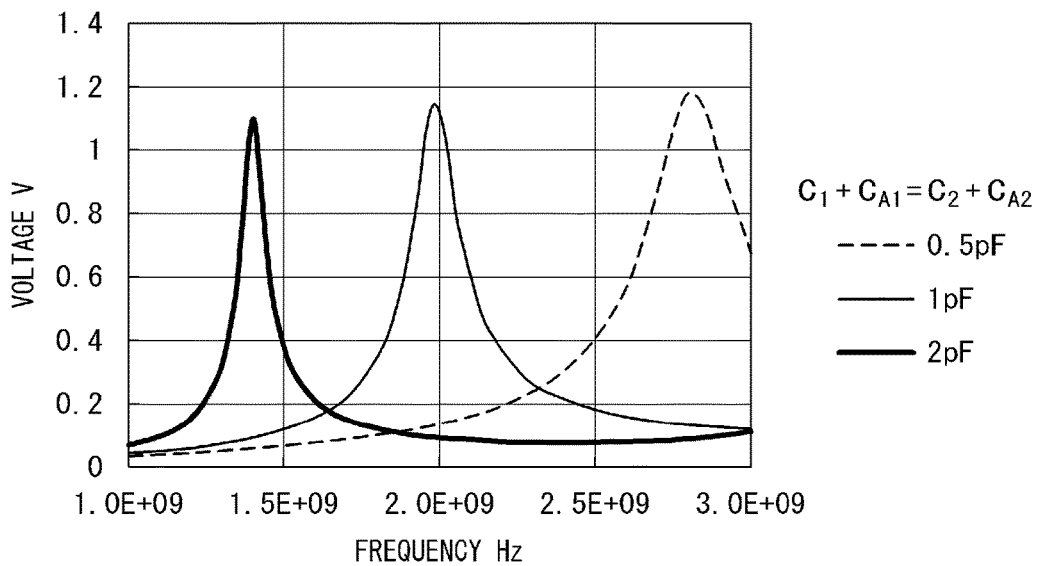
FIG. 7 is an analysis result of a measured voltage in the voltage detection circuit according to the first embodiment of the present invention.

In the equivalent circuit of the sensor according to the embodiment of the present invention, as shown in FIG. 7, it is seen that the frequency for obtaining the maximum voltage changes as indicated by an estimated value if parasitic capacitance and the variable capacitance are adjusted to the same value and the value of the variable capacitance is varied.

Figure 8:
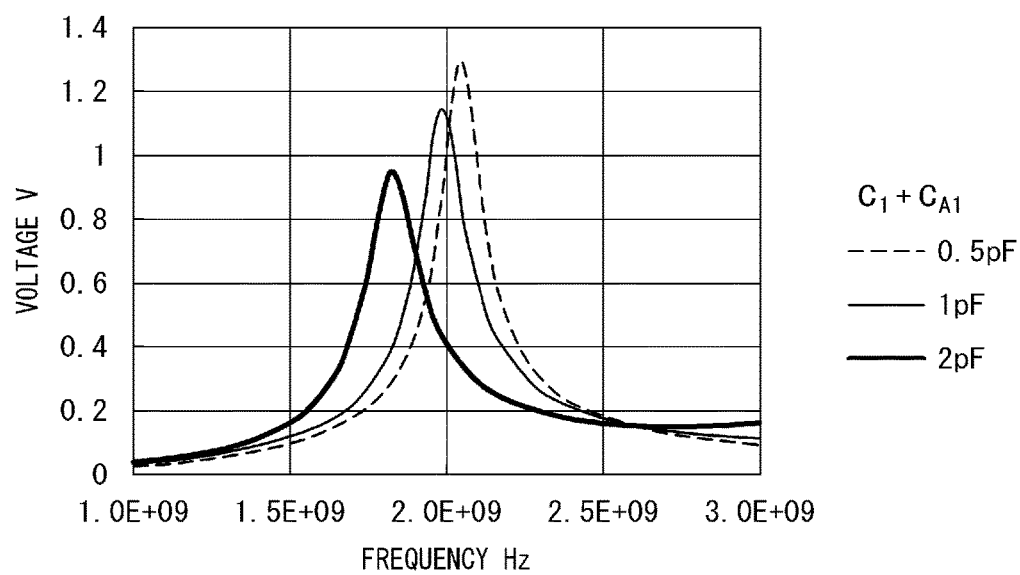
FIG. 8 is an analysis result of a measured voltage in a voltage detection circuit by a conventional low-reflection electric field sheet.

On the other hand, when the sensor does not include the variable capacitance, as shown in FIG. 8, it is seen that the frequency for obtaining the maximum voltage deviates from the estimated value even if $C_{A1}$ is varied and the frequency cannot be adjusted as estimated.

The signal processing unit 5 is capable of receiving a detection signal from each of the plurality of sensors of the sensor unit 2. When the signal processing unit 5 receives the detection signal from any one of the sensors of the sensor unit 2, the signal processing unit 5 outputs a display signal including position information of the sensor that transmits the detection signal and intensity information of the received detection signal. The signal processing unit 5 receives an image signal of an image photographed by the camera unit 4 and creates a display signal obtained by superimposing, on the image signal, the signal including the sensor position information and the intensity information of the detection signal and outputs the display signal.

The display unit 6 is capable of displaying each of the positions of the plurality of sensors of the sensor unit 2. When the display unit 6 receives the display signal, the display unit 6 displays, on the basis of the position information of the sensor and the intensity information of the detection signal included in the display signal, the position of the sensor and the intensity of the detection signal on, for example, an LCD (Liquid Crystal Display). The display unit 6 simultaneously displays the image photographed by the camera unit 4.

In this way, in the display unit 6, the information including the position information of the sensor that outputs the detection signal and the intensity information of the detection signal is superimposed on the image of the measurement target photographed by the camera unit 4 and displayed. For example, an electromagnetic field map, color display of which is changed according to the intensity of the detection signal, may be shown on the camera image. When the intensity of the detection signal is equal to or larger than a predetermined value, position information corresponding to the sensor having the intensity of the detection signal equal to or larger than the predetermined value may be superimposed on the image of the measurement target photographed by the camera unit 4 and displayed.

Measurement of an electromagnetic wave is performed by the configuration shown in FIG. 2. For example, an electromagnetic wave 9 generated from a noise source 8 of the measurement target 7 is separated by an electromagnetic wave lens 1 which is the emitting-direction separating unit, that is, an emitting direction of the electromagnetic wave emitted from the electromagnetic wave lens 1 is changed according to an arriving direction of the electromagnetic wave and is made incident on the sensor unit 2. The variable resistance of the sensor unit 2 is set to 377Ω. The sensor, on which the electromagnetic wave passed through the electromagnetic wave lens 1 is made incident to induce energy, outputs a detection single having intensity corresponding to the magnitude of the induced energy.

The signal processing unit 5 recognizes the position (a number) of the sensor that outputs the detection signal and the intensity of the detection signal. The signal processing unit 5 includes, on the inside, a table in which sensor positions (numbers) and arriving angles of electromagnetic waves are associated. The signal processing unit 5 obtains an arriving angle of the electromagnetic wave referring to the table on the basis of the position information of the sensor that outputs the detection signal. The signal processing unit 5 receives the image signal of the image photographed by the camera unit 4. The signal processing unit 5 creates a display signal obtained by superimposing, on the image signal, the signal including the sensor position information and the intensity information of the detection signal. The signal processing unit 5 displays, in the display unit 6, the position of the noise source 8 of the measurement target 7 and the magnitude of noise on the image photographed by the camera unit 4 and realizes visualization of the electromagnetic wave.

Consequently, according to the present invention, it is possible to suppress deterioration in sensitivity of electromagnetic noise in electromagnetic wave measurement. It is possible to perform the electromagnetic wave measurement with an improved real-time property by highly accurately detecting, at a desired frequency, according to an arriving direction of an electromagnetic wave, the arrival and the intensity of the electromagnetic wave with the sensors that sense an electromagnetic field and visualizing the arrival and the intensity of the electromagnetic wave.

Second Embodiment

Figure 9:
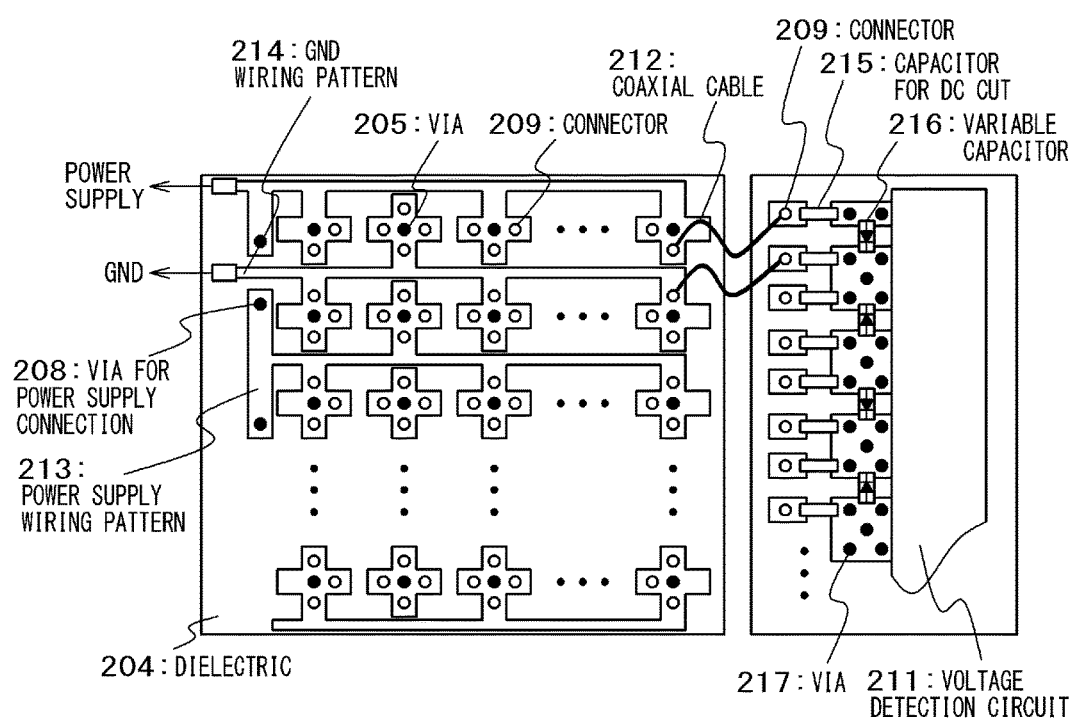
FIG. 9 is a diagram of a third layer of a low-reflection electric field sheet, which is a sensor unit, and a voltage detection circuit according to a second embodiment of the present invention.

A second embodiment of the present invention is explained with reference to FIG. 9 and FIG. 10. In the first embodiment, the parasitic capacitances of the electric field sensor and the voltage detection substrate are designed to be $C_1=C_2$. However, when the parasitic capacitances $C_1$ and $C_2$ are different, capacitors for DC cut 215 are inserted between the connectors 209 and variable capacitors 216.

By using a value considered to be electrically short at the desired frequency, the capacitors for DC cut 215 can insulate direct-current components of voltages between the variable capacitors 216 and the connectors 209 and transmit signals having the desired frequency to the voltage detection circuit 211. Since the direct-current components of the voltages between the variable capacitors 216 and the connectors 209 are insulated, it is possible to apply different DC voltages respectively to the variable capacitances $C_{A1}$ and $C_{A2}$ and set different values respectively as $C_{A1}$ and $C_{A2}$.

Figure 10:
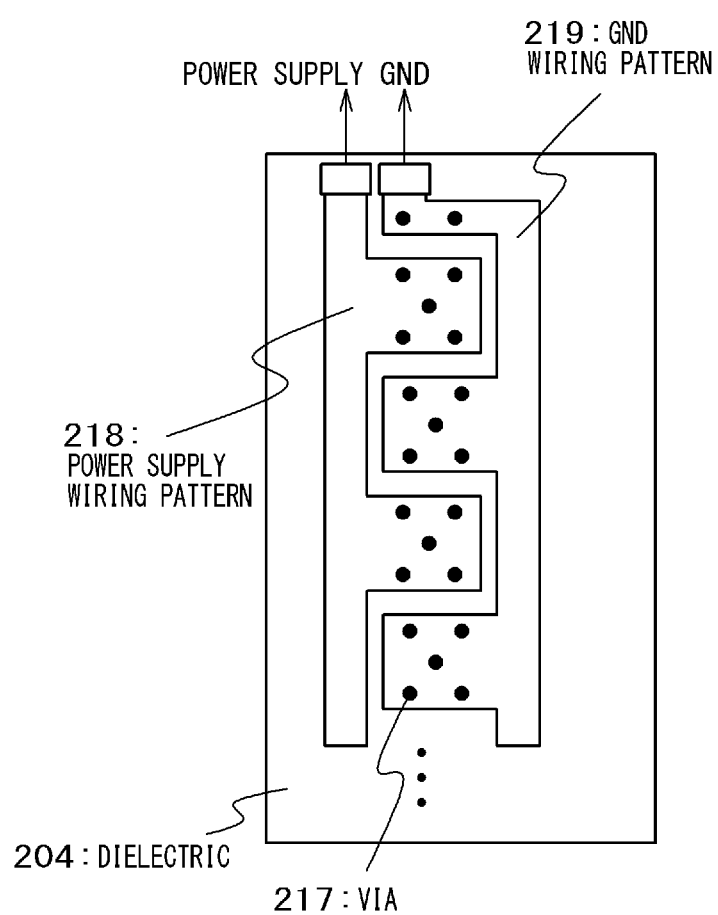
FIG. 10 is a diagram of the rear surface of the voltage detection circuit according to the second embodiment of the present invention.

Both ends of the variable capacitors 216 are respectively connected to the rear surface of the substrate by vias 217 and, as shown in FIG. 10, alternately respectively connected to the power supply and the GND wire. The DC voltages are changed by the power supply and the GND to control capacitance values of the variable capacitors 216 mounted on the voltage detection substrate. In this case, by controlling the variable capacitances $C_{A1}$ and $C_{A2}$ to satisfy $C_1+C_{A1}=C_2+C_{A2}$, it is possible to vary, according to [Expression 8], the frequency for obtaining the maximum voltage.

Consequently, according to the present invention, it is possible to suppress deterioration in sensitivity of electromagnetic noise in electromagnetic wave measurement. It is possible to perform the electromagnetic wave measurement with an improved real-time property by highly accurately detecting, at a desired frequency, according to an arriving direction of an electromagnetic wave, the arrival and the intensity of the electromagnetic wave with the sensors that sense an electromagnetic field and visualizing the arrival and the intensity of the electromagnetic wave.

Third Embodiment

Figure 11:
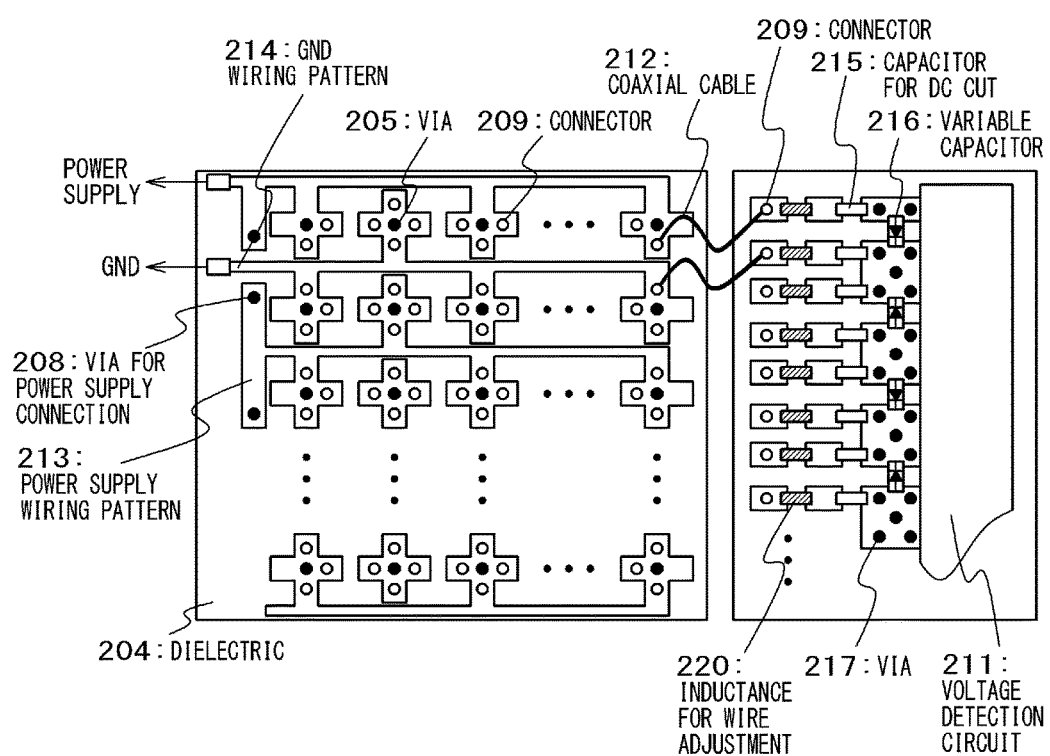
FIG. 11 is a diagram of a third layer of a low-reflection electric field sheet, which is a sensor unit, and a voltage detection circuit according to a third embodiment of the present invention.
Figure 12:
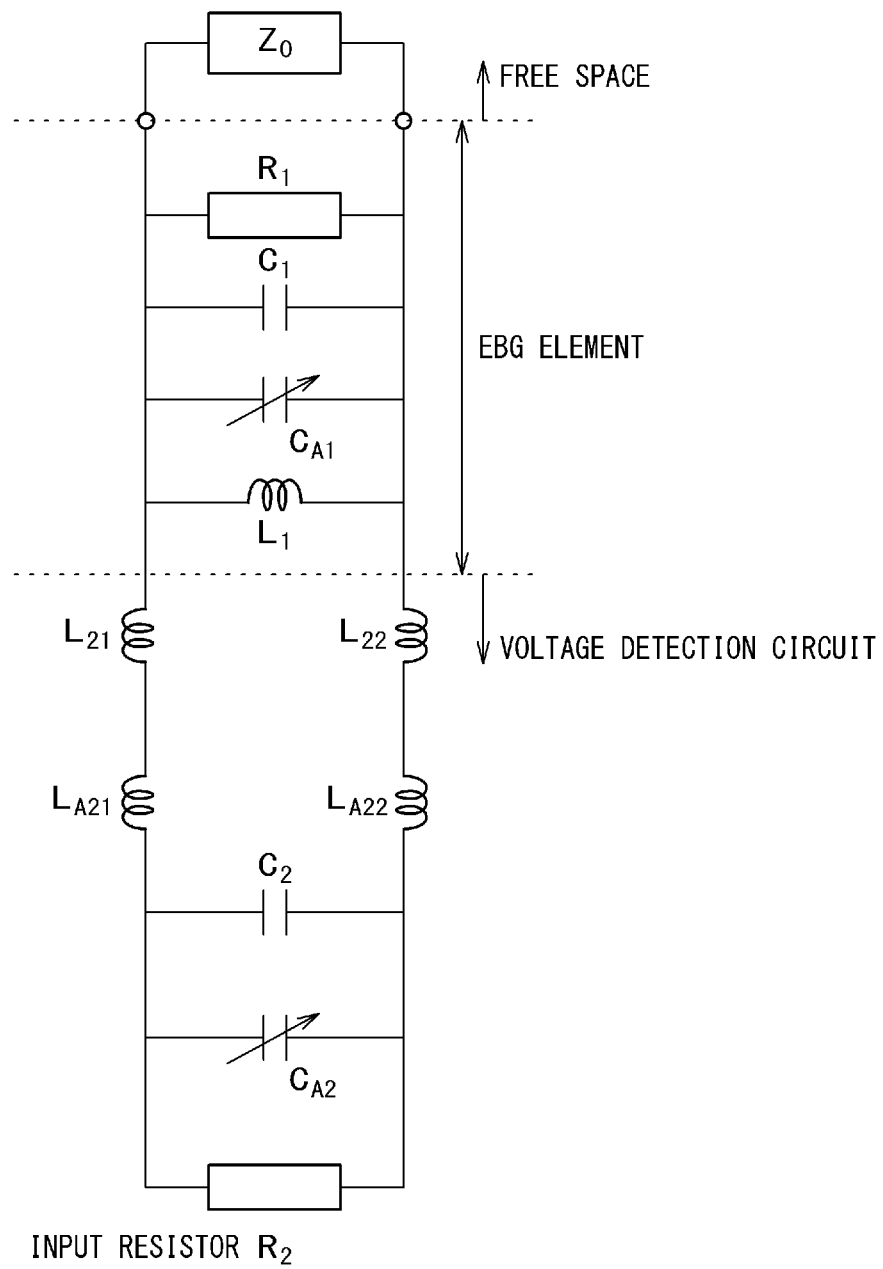
FIG. 12 is a diagram of the low-reflection electric field sheet, which is the sensor unit, and an equivalent circuit of the voltage detection circuit according to the third embodiment of the present invention.

A third embodiment of the present invention is explained with reference to FIG. 11. In the first and second embodiments, the parasitic inductance generated between the electric field sensor and the voltage detection circuit 211 is set to $L_2/2$. However, actually, since wire length is different, the parasitic resistance cannot be designed to a fixed value in some case. A parasitic inductance value is a different value for each wire in some case because the wire length is different. However, in order to align the parasitic inductance value, as shown in FIG. 1, inductances for wire adjustment 220 are mounted on the wires to adjust inductance values of the wires. The inductance values for wire adjustment may be determined on the basis of parasitic inductance generated by the wires and respectively take different values. The inductance values are controlled to satisfy [Expression 10].

$$L_{21} + L_{A21} = L_{22} + L_{A22} = \frac{L_2}{2} \qquad \text{[Expression 10]}$$

When the parasitic capacitances $C_1$ and $C_2$ are different, by inserting the capacitors for DC cut 215 between the inductances for wire adjustment 220 and the variable capacitors 216, it is possible to insulate direct-current components of voltages between the variable capacitors 216 and the inductances for wire adjustment 220 and transmit signals having the desired frequency to the voltage detection circuit 211. Since the direct-current components of the voltages between the variable capacitors 216 and the inductances for wire adjustment 220 are insulated, it is possible to apply different DC voltages respectively to the variable capacitances $C_{A1}$ and $C_{A2}$ and set different values respectively as $C_{A1}$ and $C_{A2}$. The same effects are attained by inserting the capacitances for DC cut 215 between the connectors 209 and the inductances for wire adjustment 220. By controlling the variable capacitances $C_{A1}$ and $C_{A2}$ to satisfy $C_1+C_{A1}=C_2+C_{A2}$, it is possible to vary, according to [Expression 8], the frequency for obtaining the maximum voltage. Both the ends of the variable capacitors 216 are respectively connected to the rear surface of the substrate by vias 217 and, as shown in FIG. 10, alternately respectively connected to the power supply and the GND wire. The DC voltages are changed by the power supply and the GND to control capacitance values of the variable capacitors 216 mounted on the voltage detection substrate.

Consequently, according to the present invention, it is possible to suppress deterioration in sensitivity of electromagnetic noise in electromagnetic wave measurement. It is possible to perform the electromagnetic wave measurement with an improved real-time property by highly accurately detecting, at a desired frequency, according to an arriving direction of an electromagnetic wave, the arrival and the intensity of the electromagnetic wave with the sensors that sense an electromagnetic field and visualizing the arrival and the intensity of the electromagnetic wave.

REFERENCE SIGNS LIST

1 Emitting-direction separating unit
2 Sensor unit
11 Lens
3 Capacitance adjusting unit
4 Camera unit
5 Signal processing unit
6 Display unit
7 Measurement target
8 Noise source
9 Electromagnetic wave
201a Transmission line
301a Transmission line
401a Transmission line
501a Transmission line
201 Metal pieces
202 Resistors
203 Variable capacitors
204 Dielectric
205 Vias
206 GND
207 Via holes
208 Via for power supply connection
209 Connectors
211 Voltage detection circuit
212 Coaxial cables
213 Power supply wiring pattern
214 GND wiring pattern
215 Capacitors for DC cut
216 Variable capacitors 217 Vias
218 Power supply wiring pattern
219 GND wiring pattern
220 Inductances for wire adjustment
235 Via holes for voltage detection vias

The invention claimed is:

1. An electromagnetic wave measuring apparatus comprising:
 a sensor that detects an electromagnetic wave and outputs a detection signal having intensity corresponding to magnitude of energy of the detected electromagnetic wave;
 a resistor connected electrically in parallel to the sensor;
 a first variable capacitor connected electrically in parallel to the sensor;
 a voltage detection circuit connected to the sensor;
 a second variable capacitor connected to a wire between the sensor and the voltage detection circuit so as to be electrically in parallel to the first variable capacitor; and
 a capacitance adjusting unit that adjusts capacitance values of the first variable capacitor and the second variable capacitor, wherein
 the electromagnetic wave measuring apparatus adjusts, in the capacitance adjusting unit, the capacitance values of the first and second variable capacitors and performs electromagnetic wave measurement.

2. The electromagnetic wave measuring apparatus according to claim 1, wherein the electromagnetic wave measuring apparatus includes a capacitor for DC cut between the sensor and the voltage detection circuit.

3. The electromagnetic wave measuring apparatus according to claim 2, wherein the electromagnetic wave measuring apparatus includes an inductance for wire adjustment in a wire between the sensor and the capacitor for DC cut.

4. The electromagnetic wave measuring apparatus according to claim 1, further comprising a voltage sensor connected to the resistor, wherein
 the electromagnetic wave measuring apparatus detects the electromagnetic wave according to a voltage induced in the voltage sensor.

5. The electromagnetic wave measuring apparatus according to claim 1, wherein
 the electromagnetic wave measuring apparatus includes a plurality of the sensors, and
 the electromagnetic wave measuring apparatus further comprises:
 a processing unit that receives the detection signal from each of the plurality of sensors and, when receiving the detection signal from the sensor, outputs, on the basis of position information of the sensor that transmits the detection signal, a display signal including information concerning an arriving direction of the electromagnetic wave; and
 a display unit that displays each of the arriving directions of the plurality of electromagnetic waves and, when receiving the display signal, displays, on the basis of the position information of the sensor included in the display signal, the arriving direction of the electromagnetic wave based on a position of the sensor.

6. The electromagnetic wave measuring apparatus according to claim 5, wherein
 the processing unit outputs the display signal including intensity information of the detection signal together with the position information of the sensor that transmits the detection signal, and the display unit performs display corresponding to the intensity of the detection signal when displaying the arriving direction of the electromagnetic wave based on the position of the sensor.

7. The electromagnetic wave measuring apparatus according to claim 5, wherein, when the intensity of the detection signal received from the sensor by the processing unit is equal to or larger than a predetermined value, the display unit performs predetermined display irrespective of the intensity of the detection signal when displaying the arriving direction of the electromagnetic wave.

8. The electromagnetic wave measuring apparatus according to claim 5, further comprising a camera unit that photographs an image of a measurement target and outputs an image signal of the photographed image, wherein
 when receiving the image signal from the camera unit and the detection signal from the sensor, the processing unit outputs another display signal including the image signal and the arriving direction of the electromagnetic wave obtained from the position information of the sensor that transmits the detection signal, and
 when receiving the another display signal, the display unit performs, on the basis of the image signal included in the another display signal and arriving direction information of the electromagnetic wave obtained from the position information of the sensor, display of the arriving direction of the electromagnetic wave to be superimposed on the image by the image signal.

9. The electromagnetic wave measuring apparatus according to claim 1, further comprising an emitting-direction separating unit that changes an emitting direction of the electromagnetic wave according an incident direction of the electromagnetic wave, wherein
 the electromagnetic wave measuring apparatus detects, with the sensor, the electromagnetic wave emitted from the emitting-direction separating unit.

10. The electromagnetic wave measuring apparatus according to claim 9, wherein the emitting-direction separating unit is configured by an electromagnetic wave lens.

11. An electromagnetic wave measuring method comprising: detecting an electromagnetic wave; and adjusting capacitances of a first variable capacitor connected electrically in parallel to a sensor that is electrically in parallel to a resistor and outputs a detection signal having intensity corresponding to magnitude of energy of the detected electromagnetic wave and a second variable capacitor connected to a wire between the sensor and a voltage detection circuit connected to the sensor so as to be electrically in parallel to the first variable capacitor and performing electromagnetic wave measurement.

12. The electromagnetic wave measuring method according to claim 11, further comprising adjusting the capacitances such that a sum of values of the capacitance of the first variable capacitor and parasitic capacitance of the sensor is equal to a sum of values of the capacitance of the second variable capacitor and parasitic capacitance of the wire of the voltage detection circuit.

* * * * *